United States Patent [19]

Fukuhara et al.

[11] Patent Number: 5,073,777
[45] Date of Patent: Dec. 17, 1991

[54] PLURAL DELTA-SIGMA CONVERTERS OPERATING IN PARALLEL WITH INDEPENDENT DITHER GENERATORS

[75] Inventors: Kohji Fukuhara, Matsudo; Yoshio Yamasaki, Tokyo, both of Japan

[73] Assignee: Texas Instruments Incorporated, Dallas, Tex.

[21] Appl. No.: 493,035

[22] Filed: Mar. 12, 1990

[30] Foreign Application Priority Data

Mar. 13, 1989 [JP] Japan .................................. 1-61389

[51] Int. Cl.⁵ .............................................. H03M 1/20
[52] U.S. Cl. ..................................... 341/131; 341/143
[58] Field of Search ........................ 341/143, 159, 131

[56] References Cited

U.S. PATENT DOCUMENTS

| | | | |
|---|---|---|---|
| 3,999,129 | 12/1976 | Kasson | 341/131 |
| 4,187,466 | 2/1980 | Kasson et al. | 341/131 |
| 4,761,634 | 8/1988 | Yamaguchi et al. | 341/131 |
| 4,926,178 | 5/1990 | Mallinson | 341/143 |
| 4,926,180 | 5/1990 | Anastassiou | 341/159 |
| 4,947,171 | 8/1990 | Pfeifer et al. | 341/143 |

OTHER PUBLICATIONS

Yamasaki, The Application of Large Amplitude Dither to the Quantization of Wide Range Audio Signals, Journal of the Acoustical Society of Japan, vol. 39, No. 7, 1983, pp. 452–462.

*Primary Examiner*—Howard L. Williams
*Attorney, Agent, or Firm*—William E. Hiller; N. Rhys Merrett; Melvin Sharp

[57] ABSTRACT

The invention is structured to add each output signal of a plurality of signal converters connected in parallel, after a common signal is inputted to and quantized in the above plurality of signal converters, having a noise generators which input noise generated utilizing random variables unrelated to each other to respective quantizers within the above plurality of signal converters, so that quantization noise, Q, or the like can be effectively averaged, and a highly reliable signal conversion device, which can ensure an enough dynamic range across a wide frequency region, can be provided.

Also, the invention is structured to add each output signal of a plurality of signal converters connected in parallel, after a common input signal is inputted to and quantized in the above plurality of signal converters, so that a highly reliable signal conversion device similar to the above can be provided.

7 Claims, 9 Drawing Sheets

|  | Q1 | Q2 | Q3 |
|---|---|---|---|
| INITIAL VALUE | 1 | 1 | 1 |
|  | 0 | 1 | 1 |
|  | 0 | 0 | 1 |
|  | 1 | 0 | 0 |
|  | 0 | 1 | 0 |
|  | 1 | 0 | 1 |
|  | 1 | 1 | 0 |
|  | 1 | 1 | 1 |

1 PERIOD = $2^3 - 1 = 7$

FREQUENCY
PRIOR ART
FIG. 10

PLURAL DELTA-SIGMA CONVERTERS OPERATING IN PARALLEL WITH INDEPENDENT DITHER GENERATORS

BACKGROUND OF THE INVENTION

1. Field of the Invention

This invention relates to signal conversion devices.

2. Description of the Prior Art

Recently, attention is being paid to AD (analog-digital) and DA (digital-analog) conversion techniques, so-called $\Delta - \Sigma$ modulation systems, which are suitable for, for example, acoustic measurement or the like, employing over-sampling methods to obtain enough dynamic range in a low frequency region (for example, the frequency region of around 20 KHz which is within the human audible region) by concentrating spectrum distribution of quantization noise in a high frequency region. Such $\Delta - \Sigma$ modulation systems are described in detail in, for example, Nikkei Electronics 1988. 8. 8. (No. 453), pp. 216-220, or Radio Technology September 1987, pp. 37-44, and thus detailed description thereof will be omitted here.

$\Delta - \Sigma$ modulators differentiate quantization noise, Q, which is generated in quantizers (hereinafter called partial quantizers) contained therein, and thereby a desirable dynamic range is obtained by a fewer number of bits in a low region where the quantization noise is supressed. The transfer characteristic of the $\Delta - \Sigma$ modulator with k order is represented in the below formula (1) with an input X, an output Y, and noise Q of partial quantizers.

$$Y = X + (1 - Z^{-1})^k \cdot Q \quad (1)$$

The $\Delta - \Sigma$ modulator represented by formula (1) may be realized by various methods, but all which have final outputs described by formula (1) are called $\Delta - \Sigma$ modulators here. $(1 - Z^{-1})^k$ in formula (1) shows a differential characteristic, and if the partial quantizers have a straight-line quantization characteristic and have a quantized value of $2^m$, this $2^m$ value can be encoded to m bits.

Under the condition of a quantization step width of the partial quantizers being $\Delta$ and the quantization noise always being distributed within the range of $\pm \Delta/2$, the quantization noise, Q, may be regarded as white noise distributed in the range of $\pm \Delta/2$, with their power (quantization noise power) being $\Delta^2/12$. If an operation clock of the $\Delta - \Sigma$ modulators (a sampling frequency) is $f_s$, the above power can be regarded as being distributed uniformly in a band region up to $f_s/2$ (the Nyquist frequency), and thus a power density thereof is $\Delta^2/12 \cdot 2/f_s$. On the other hand, an amplitude characteristic of the differential characteristic $(1-Z^{-1})^k$ becomes $|(1-Z^{-1})^k| = 2^k \cdot \sin^k(\pi f/f_s)$ when $Z^{-1}$ equals $e^{equals\, e-j2\pi f/f_s}$, and spectrum Nf of the differentiated quantization noise $(1-Z^{-1})^k \cdot Q$ becomes $$Nf = 2^k \cdot \sin^k(\pi f/f_s) \cdot \sqrt{\Delta^2/12 \cdot 2/f_s}.$$

Figure 12:
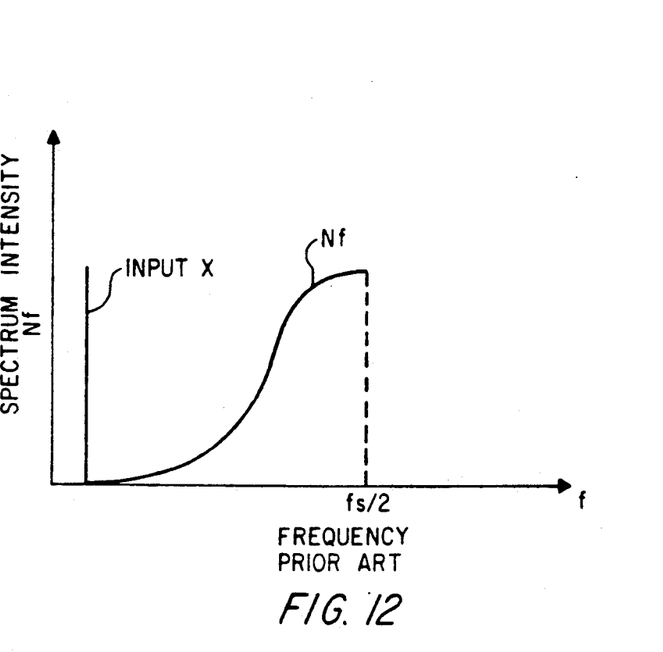
FIG. 12 shows spectrum intensity-frequency characteristic in $\Delta - \Sigma$ modulation system of k order.

The spectrum Nf shown in this formula is a curve as shown in FIG. 12. The input X here is assumed to be a sine wave.

Next, with regard to FIGS. 9-11, the principle of a secondary $\Delta - \Sigma$ modulator will be described.

Figure 9:
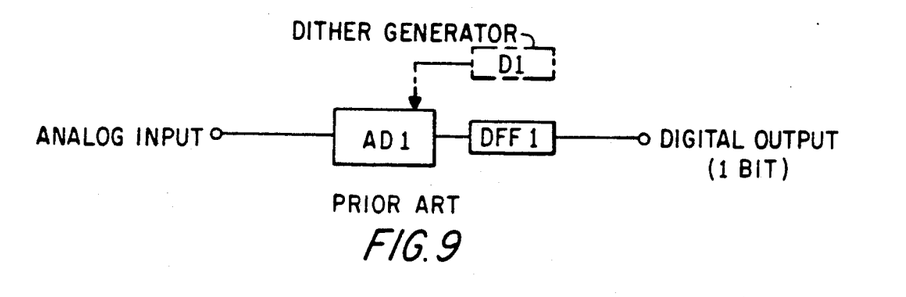
FIG. 9 is a schematic block diagram showing a prior AD conversion device.
Figure 11:
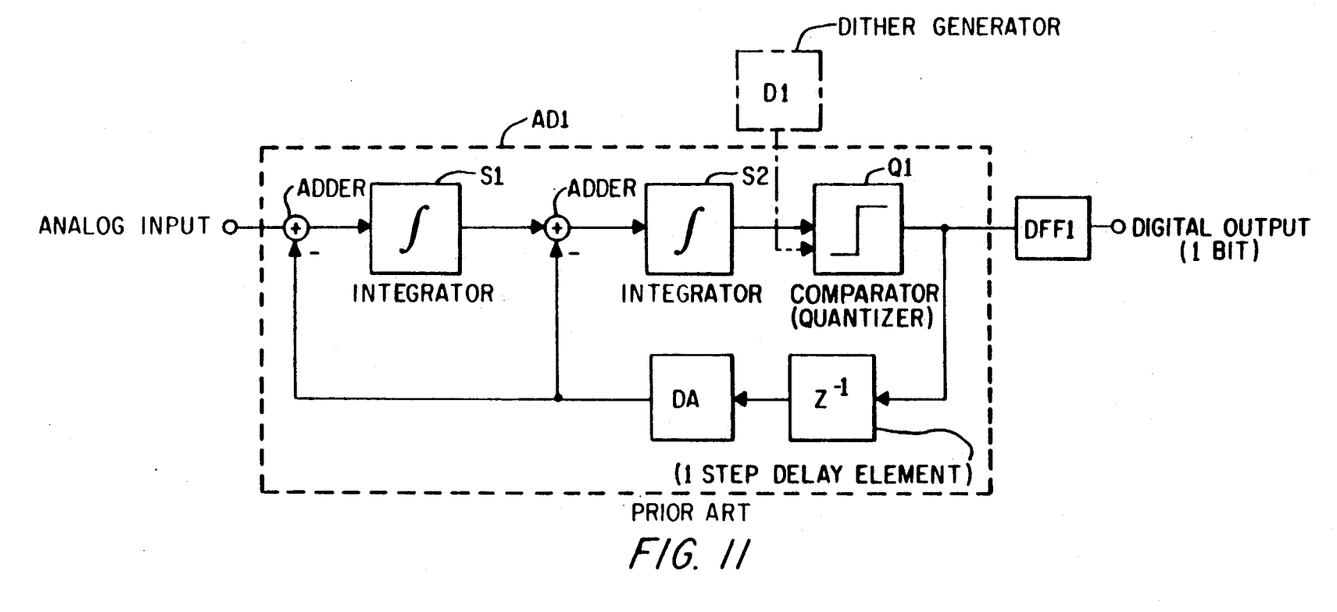
FIG. 11 is a schematic block diagram showing an inner structure of the AD conversion device of FIG. 9.

An inner structure of an AD converter AD1 (a secondary $\Delta - \Sigma$ modulator) in FIG. 9 comprises, as shown in FIG. 11, two integrators S1 and S2 each connected one step ahead to a comparator (quantizer) Q1, and a feedback loop which goes from an output of the comparator Q1 to each input of these integrators S1 and S2 through a one step delay element $Z^{-1}$ and a DA converter. A D flip-flop DFF1 is connected to the output of the comparator Q1 to establish the timing of the digital output (a PDM wave: Pulse Density Modulation).

The above structure may be represented as $Y = X + (1 - Z^{-1})^2 \cdot Q$ by the above formula (1) of the transfer function. It presents, as shown in FIG. 11, signal elements contained in the output being equal to the input signal (in this case, a sine wave) by providing the secondary integrators (that is, the two integrators S1 and S2) preceding the comparator Q1, and also only a quantization noise, Q, taking the form of a secondary finite difference.

Figure 10:
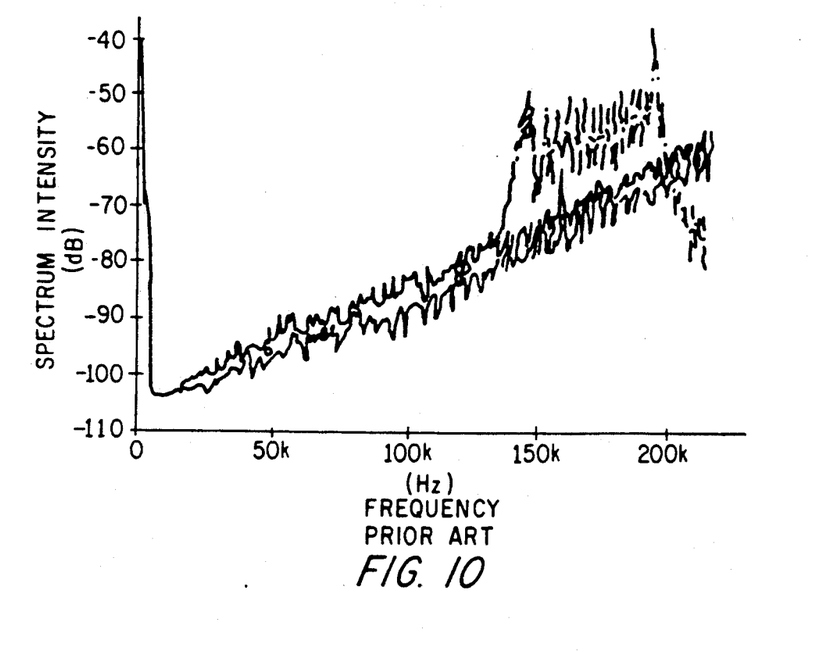
FIG. 10 shows spectrum intensity-frequency characteristic of an output in the example of FIG. 9.

Actually, in FIGS. 9 and 11, when an output is observed by a high performance spectrum analyzer or the like with an input signal of 1 KHz, a sine wave of $-40$ dB, and a sampling frequency $f_s$ of, for example, 6 MHz, the wave form shown in FIG. 10 can be seen. Also, the quantization noise, Q, may be made white noise which is unrelated to the input signal, by adding to the input signal a uniformly distributed random variable as a so-called dither (a kind of white noise), before quantization and then substracting the same dither after the quantization, as shown in phantom in FIGS. 9 and 11, the wave shown in phantom in FIG. 10, being seen with output observed in the same way as above. Conversion precision can be improved by addition/subtraction of a dither with larger amplitude in the above, and similar effects as addition/subtraction of the dither may be obtained in a low frequency region even without subtraction, by adding to the input signal the dither (in this case, a so-called "colored noise", noise which concentrates in a specific frequency region) concentrated by a band pass filter or the like in a high frequency region (for example, 120 KHz-200 KHz) (see Yamazaki, "Application of a Large Amplitude Dither to Quantization of Wide Band Region Acoustic Signals", Onkyogakukaisi 39(7) pp. 452-462 (1983), and Nishitoba, Ohtani, Asotani, Yamazaki, and Itoh, "Improvement of AD Conversion Precision by Large Amplitude Dithers and High Speed Sampling", Denonkensi EA82-72 (1983)).

Therefore, even in doing like the above, enough dynamic range (S/N for a full scale sine wave: that is, a relation between a dynamic range DR and quantization bit number m is generally represented by $DR = 6.02 m + 1.76 (dB)$) would not be ensured across a wide band region in the low frequency region.

Generally, a distribution of the quantization noise concentrates in a higher region by raising orders of the $\Delta - \Sigma$ modulators, but inner circuits become unstable in the $\Delta - \Sigma$ modulators of the third order and over.

SUMMARY OF THE INVENTION

A purpose of the invention is to provide a highly reliable signal conversion device which can ensure an enough dynamic range across a wide frequency band region.

This invention relates to such a signal conversion device which is structured to add each output signal of a plurality of signal converters connected in parallel, after a common signal is inputted to and quantized in the above plurality of signal converters, having noise generators which input noise generated utilizing random variables unrelated to each other to respective quantizers within the above plurality of signal converters.

Also, this invention provides a signal conversion device which is structured to add each output signal of a plurality of signal converters connected in parallel, after a common signal is inputted to and quantized in the above plurality of signal converters.

BRIEF DESCRIPTION OF THE DRAWINGS

FIGS. 1-8 show embodiments of the invention;

FIGS. 9-12 show prior art;

In reference numerals shown in the figures:
AD1, AD2 . . . ADn: AD converters;
DA1, DA2 . . . DAm: DA converters;
Q1: quantizer;
D1, D2 . . . Dn, D11, D12 . . . D1m: dither generators;
S1, S2: integrators; and
DFF1, DFF2, H1, H2 . . . H33: D flip-flops.

DESCRIPTION OF THE PREFERRED EMBODIMENTS

Hereinafter, embodiments of the invention will be described.

FIGS. 1-5 show an embodiment in which the invention is applied to an AD modulation device.

Figure 1:
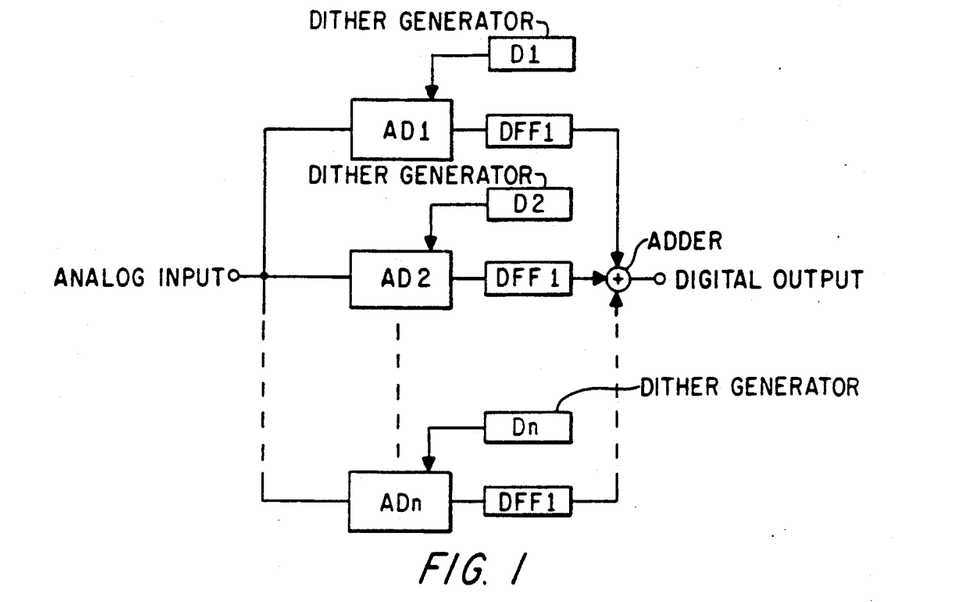
FIG. 1 is a schematic block diagram showing an embodiment in which the invention is applied to an AD conversion device (that is, the AD conversion device which has n AD converters connected in parallel each with a different dither generator connected thereto respectively)
Figure 2:
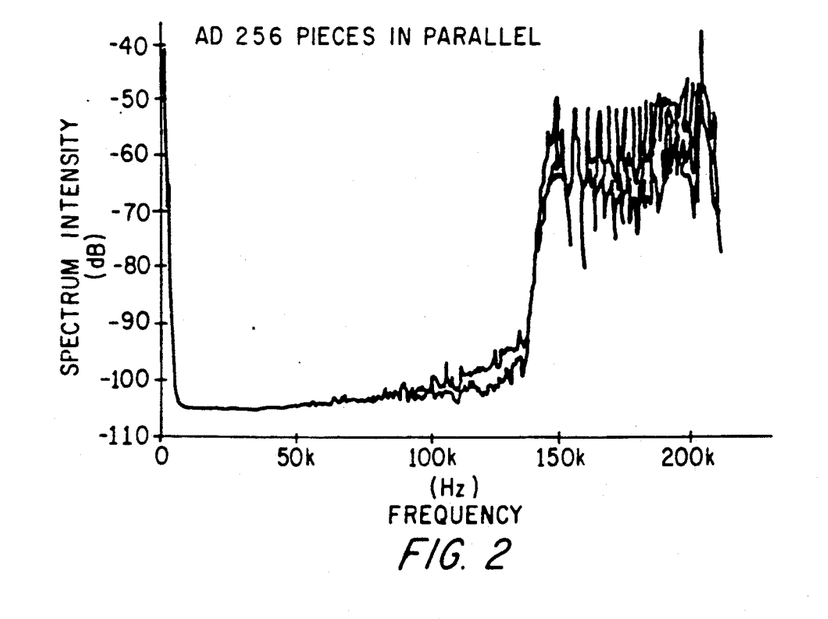
FIG. 2 shows spectrum intensity-frequency characteristic of an output in a case where 256 AD converters would be actually connected in parallel in FIG. 1.

As shown in FIG. 1, a plurality of AD converters (secondary $\Delta - \Sigma$ modulators) AD 1 with a dither generator D1, are connected in parallel, between an input and an output in the above embodiment of FIGS. 10 and 12. That is, AD converters AD1, AD2 . . . ADn with each different dither D1, D2 . . . Dn being connected to each quantizer in the AD converters, are respectively connected between the input and the output; and each output of these AD converters is connected to each D flip-flop DFF1 to be further added.

Figure 3:
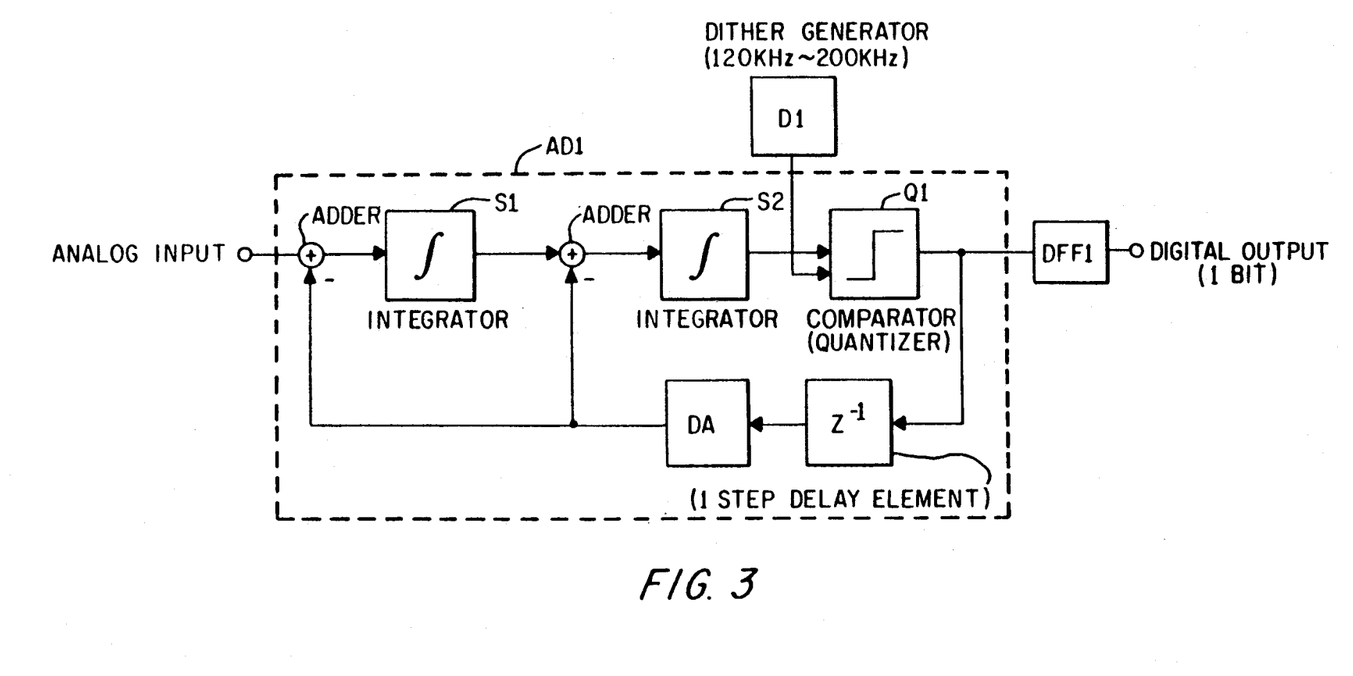
FIG. 3 is a block diagram showing an inner structure of each AD converter in FIG. 1.
Figure 4:
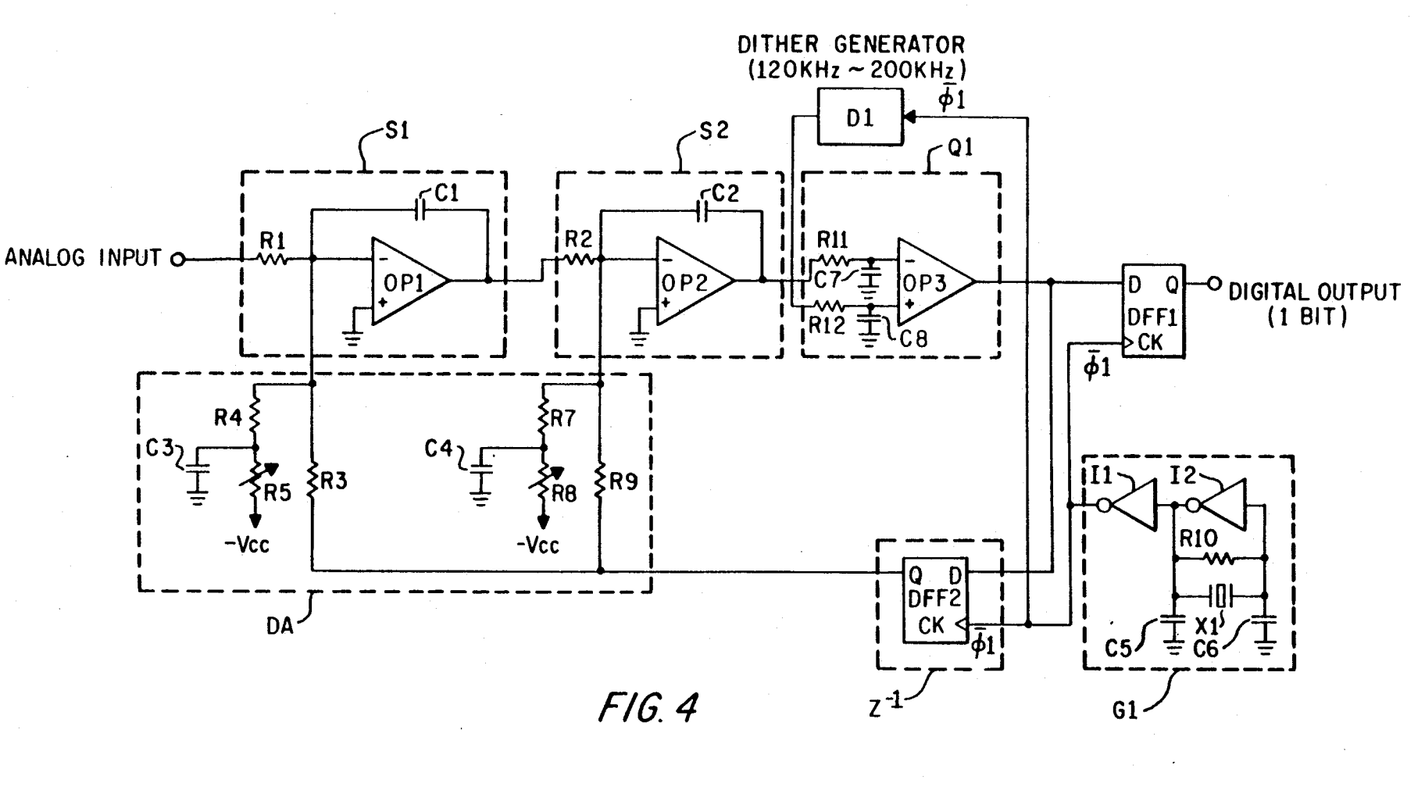
FIG. 4 is a circuit diagram showing a specific example of FIG. 3.

FIG. 3 shows an inner structure of the AD converter AD1; and the dither generator D1 concentrated on a band region of, for example, 120 KHz–200 KHz, is connected to a quantizer (comparator) using a band pass filter, BPF, (shown later in FIG. 5A) or the like, as in the embodiment of FIGS. 10 and 12. FIG. 4 is a more detailed circuit diagram of FIG. 3. That is, integrators S1 and S2 are respectively constituted of a resistor R1, a condenser C1 and an operational amplifier OP1, and a resistor R2, a condenser C2 and an operational amplifier OP2; a quantizer Q1 is constituted of an operational amplifier OP3, resistors R11 and R12, and condensers C7 and C8; furthermore, one step delay element $Z^{-1}$ is constituted of a D flip-flop. Also, a DA converter DA is constituted of resistors R3 and R4, a rheostat R5 and a condenser C3 as well as resistors R7 and R9, a rheostat R8 and condenser C4. An output of a dither generator D1 is connected to a + terminal of the operational amplifier OP3 through the resistor 12.

In the DA converter DA, the rheostats R5 and R8 are each connected to minus supply voltage $(-V_{cc})$. An output $\phi 1$ (sampling frequency $f_s$) of a clock generator G1, which is constituted of condensers C5 and C6, a crystal oscillator X1, a resistor R10, and inverters I1 and I2, is connected to CK terminals of D flip-flops DFF1 and DFF2 and to an input of the dither generator D1, respectively.

Next, with regard to the operation in FIG. 4, an inputted analog signal (a sine wave in this case) goes through the integrators S1 and S2, and then is converted to a digital signal in the comparator Q1. This digital signal is then outputted and passed through the DFF 2 to be one sample delayed, and then returned to inputs of the two integrators S1 and S2. N AD converters AD1 constituted as above are placed in parallel as in FIG. 1 for digital adding. A result thereof is outputted with data thinned out, to be a required sampling frequency. Normally, a digital signal of plural bit numbers (in this case 1 bit) of a desired sampling frequency is obtained by a FIR (Finite Impulse Response) form decimation filter connected (to an output of the D flip-flop DFF1) after the AD1.

Figure 5A:
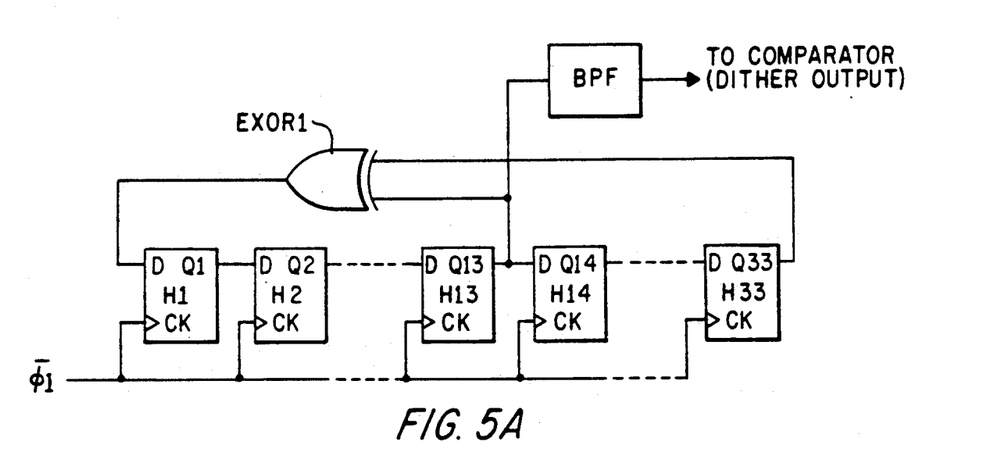
FIG. 5A is a circuit diagram showing a specific example of each dither generator.

FIG. 5A shows a circuit structure of the dither generator D1 in FIGS. 1 and 3. The dither D1 is a binary signal taking a value 0 or 1, which is called an M system signal, and is a kind of pseudo-random signal having periodicity. This signal may be regarded as approximating white noise. The characteristic of this signal is well known; its generation is reproducible; and the generation method is simple.

As seen in FIG. 5A, a 33-step shift register made of 33 D flip-flops H1, H2 . . . H33 connected in series is structured with a feedback circuit using an exclusive OR, EXOR 1. A band pass filter, BPF in the figure, is, as described above, to concentrate a dither output in a band region of, for example, 120 KHz–200 KHz (that is, to convert it into the above described colored noise by the band pass filter, BPF). The number of the above D flip-flops and the location to take out the dither output are so set that each suitable value is outputted as a dither output.

Figure 5B:
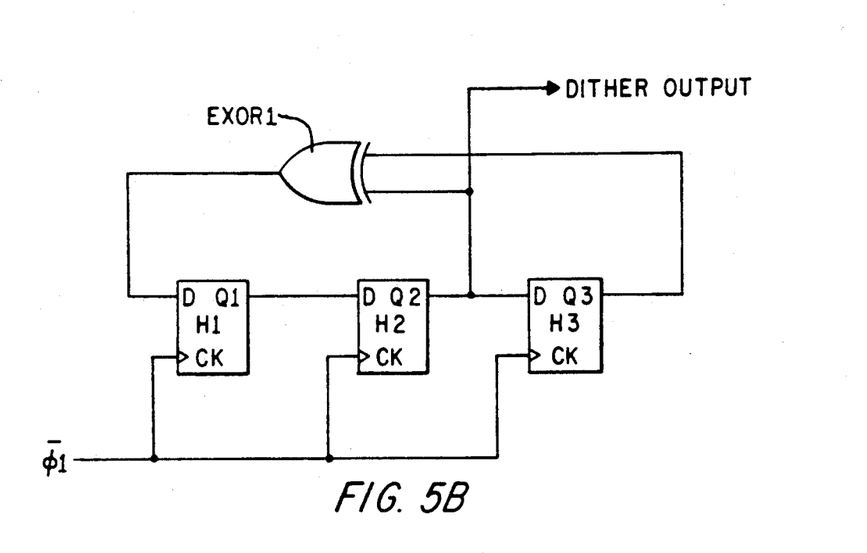
FIG. 5B illustrates operation of a dither generator by a three-step shift register.
Figure 5C:
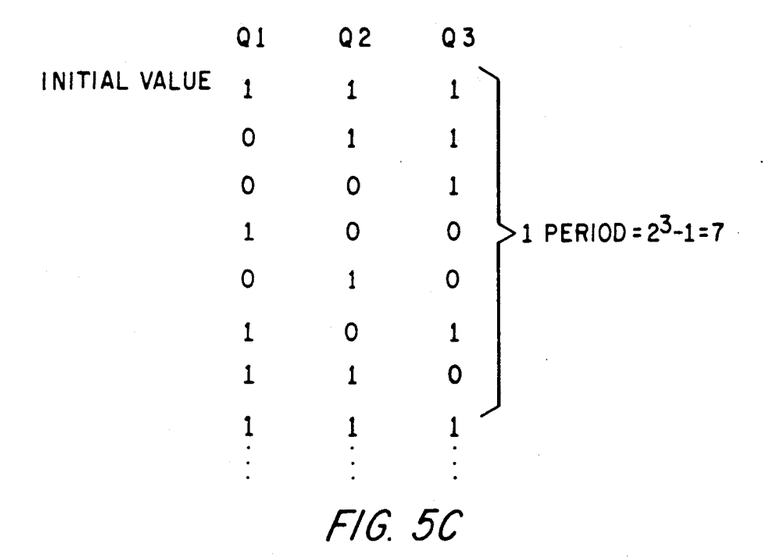
FIG. 5C is a table of truth value illustrating the operation in FIG. 5B.

In regard with FIGS. 5B and 5C, the operation of the dither generator D1 will be described using a three-step shift register made of D flip-flops H1, H2, and H3 to facilitate understanding. As seen in FIG. 5C, with an initial value "111" for outputs Q1, Q2, and Q3 of each D flip-flop H1, H2, and H3, these signals become outputs having a periodicity of $2^3-1=7$ as one period (n is the number of D flip-flops, generally having the periodicity of $2^n-1$).

As illustrated in the above, the AD conversion device of the embodiment is structured to add each output signal of a plurality of AD converters AD1, AD2 ... ADn connected in parallel, after a common signal is inputted to and quantized in the above plurality of AD converters AD1, AD2 ... ADn, having dither generators D1, D2 ... Dn which input noise (in this case, the above so-called colored noise) generated utilizing random variables unrelated to each other to respective quantizers Q1 ... Qn (Q2 ... Qn are not shown) within the above plurality of AD converters AD1, AD2 ... ADn, so that the above quantization noise, Q, can be effectively averaged (whitened). In the case that 256 AD converters are connected in parallel, each with a different dither generator connected thereto, the spectrum distribution shown in FIG. 2 may be obtained, which shows that a dynamic range of over 100 dB is ensured across a wider frequency band region, compared with the prior art in FIG. 11. The result shown in FIG. 2 was obtained by using, for example, a high performance spectrum analyzer (3850, Hewlett-Packard, Ltd.) which is currently being used; and a dynamic range of about 120 dB would be actually ensured, although further measurement can not be performed because of limited performance of the measuring device.

Therefore, data may be recorded by being outputted to, for example, DAT (Digital Audio Tape) or the like as a highly reliable digital output with very little noise or the like. The above each circuit structure may easily form a high precision AD conversion device by forming many converters of this type on the same chip and connecting them in parallel, with a digital IC technology which is good at a comparatively simple structure.

Figure 6:
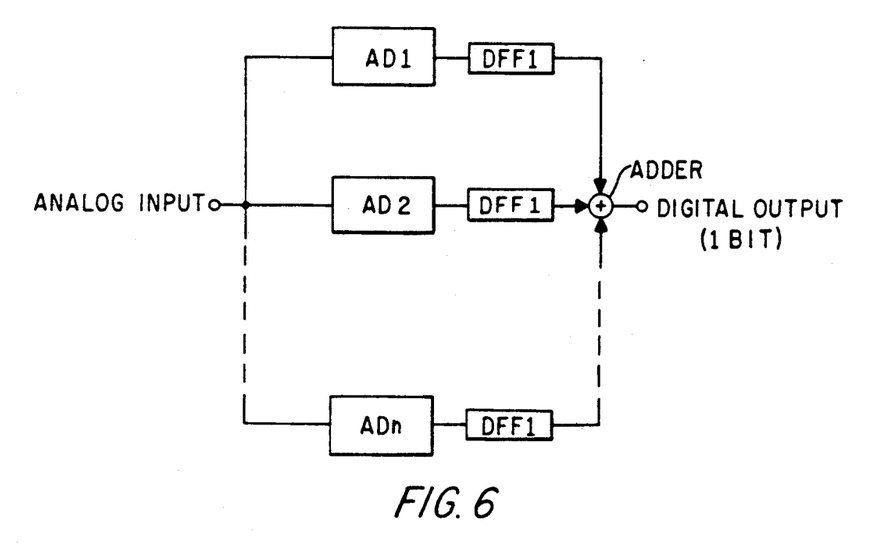
FIG. 6 is a block diagram showing another embodiment of the invention.

FIG. 6 shows another embodiment of the invention, having a circuit structure without the dither generators D1, D2 ... Dn in each AD1, AD2 ... ADn in the above embodiment of FIG. 1. Also in this case, the quantization noise, Q, may be averaged (whitened) as in the above (in this case, the quantization noise, Q, can be averaged by differences in inner circuits of each AD converter itself), and the dynamic range may be ensured.

Figure 7:
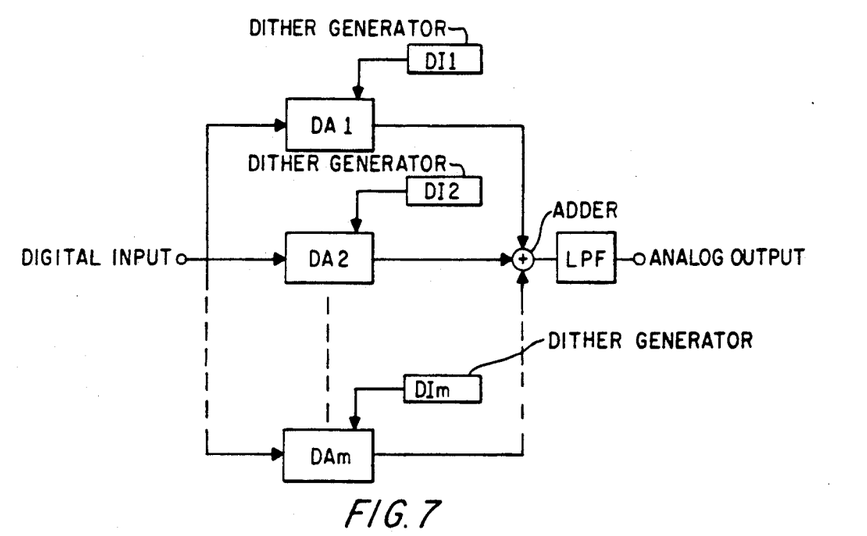
FIG. 7 is a schematic diagram showing an embodiment in which the invention is applied to a DA conversion device.
Figure 8:
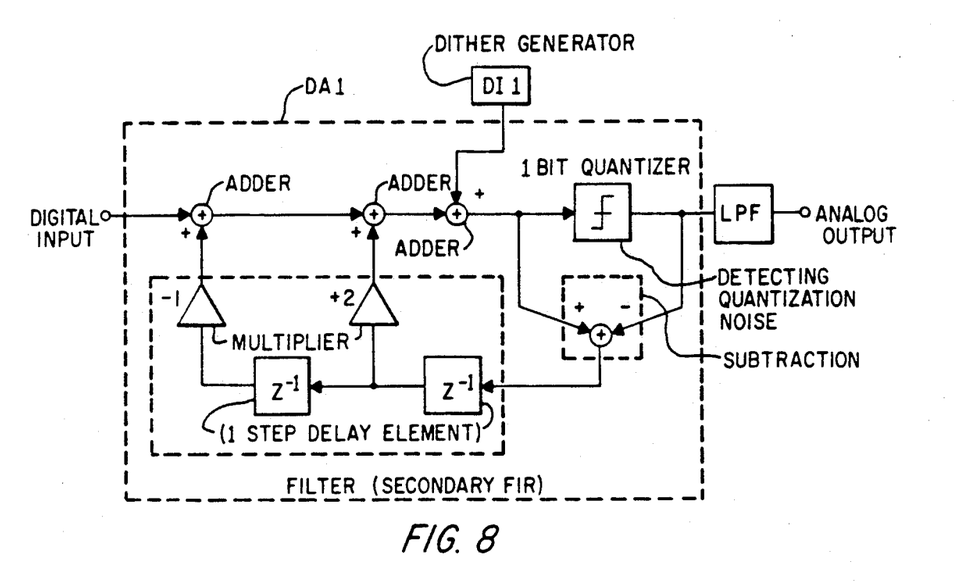
FIG. 8 is a schematic block diagram showing an inner structure of each DA converter in FIG. 7.

FIGS. 7 and 8 show another embodiment of the invention, in which the invention is applied to a DA converter device. The basic structure thereof will not be described here because it is the same as that of the above embodiment in FIGS. 1-5, but structural differences are D flip-flops being not connected to outputs of each DA converter DA1, DA2 ... DAm, and a low pass filter LPF being connected, followed by an output adder.

As seen in FIG. 8, each DA converter DA1, DA2 ... DAm in FIG. 7 is structured with a so-called secondary noise shaping system (FIG. 8 shows an inner structure of one DA converter DA1, but the other DA2 ... DAm are structured similarly as well), and a dither generator 11 is connected to a 1 bit quantizer as in the above embodiment. The above secondary noise shaping is described in detail, for example, in the above Radio Technology, SEP. 1987, pp. 39-41, and thus detailed description thereof is omitted here.

Next, with regard to the operation in FIG. 8, an input signal in this case is an digitized analog signal of n bits (n is a positive integer), for example, a sampling data of 16 bits. Inputted data is quantized by the 1 bit quantizer at the speed of M multiple (M is a positive integer, for example, 128 multiple). The 1 bit data is outputted and outputs the difference with the input of the quantizer as quantization noise, passing respectively through two delay circuits $Z^{-1}$ and two multipliers, to return digitally to the inputs. The quantization noise, Q, is whitened by adding a dither concentrated in a high region by a band pass filter, BPF, prior to the quantization, as in the above embodiment.

Therefore, as illustrated in the above, the DA conversion device of the invention is structured to add each output signal of a plurality of DA modulators DA1, DA2 ... DAm connected in parallel, after a common input signal [for example, a digital input signal from CD (Compact Disk) player, DAT (Digital Audio Tape), or the like] is inputted to and quantized in the above plurality of DA converters DA1, DA2 ... DAm, as shown in FIG. 7, having dither generators DI1, DI2 ... DIm which input noise (so-called colored noise similar to the above embodiment) generated utilizing random variables unrelated to each other to respective quantizers (each 1 bit quantizer) within the above plurality of DA converters DA1, DA2 ... DAm, so that the quantization noise, Q, can be effectively averaged (whitened) as in the above embodiment, and dynamic range may be ensured enough across a wide frequency band region. As a result, output may be made to, for example, a speaker or the like as highly reliable analog output with excellent reproducibility.

Also, the DA conversion device of the embodiment may be structured as in the embodiment of FIG. 6, in which the same advantages as in the above may be obtained.

Also characteristically, as in the above embodiment, a high precision DA conversion device may be easily structured by forming many converters of this type on the same chip and connecting them in parallel, with digital IC technology which is good for use in producing many of comparatively simply structured circuits.

In the case of structuring the above embodiment of the AD conversion device in FIGS. 1-5 and the above embodiment of the DA conversion device in FIGS. 7 and 8 as one system, an output of the AD conversion device in FIG. 1 is recorded at DAT or the like as a 16 bit digital output by a decimation filter or the like; and then the recorded 16 bit digital data is outputted to a speaker or the like as a reproduced analog output by the DA conversion device in FIG. 7. By structuring the invention as a system as described above, a highly reliable system with very little noise or the like may be structured, which is favorable.

Although the invention has been illustrated hereinabove with embodiments, the above embodiments may be further modified based on the technical idea of the invention.

For example, the number of the above AD (DA) converters and the dither generators may be appropriately changed, the more the number thereof, the better it is. Also, in the above embodiments, the invention is applied to the $\Delta-\Sigma$ modulation system, but it may also appropriately be applied to others such as sequential converters or the like.

Also, in the above embodiments, a noise (colored noise), which is concentrated in only a specific frequency band region by connecting a band pass filter, BPF, or the like to each output, is used as each dither generator; but normal dither generators without a band pass filter, BPF, or the like connected to each output may be used, in which dithers (white noise) added to each may be later subtracted as described above.

Also, a sampling frequency $f_s$ may be appropriate value, and bit numbers of the quantizers, step width $\Delta$ of the quantization, or the like may be variously changed.

EFFECTS OF THE INVENTION

As described above, the invention is structured to add each output signal of a plurality of signal converters connected in parallel, after a common signal is inputted to and quantized in the above plurality of signal converters, having noise generators which input noise generated utilizing random variables unrelated to each other to respective quantizers within the above plurality of signal converters, so that quantization noise, Q, or the like can be effectively averaged, and a highly reliable signal conversion device, which can ensure an enough dynamic range across a wide frequency region, can be provided.

Also, the invention is structured to add each output signal of a plurality of signal converters connected in parallel, after a common input signal is inputted to and quantized in the above plurality of signal converters, so that a highly reliable signal conversion device similar to the above can be provided.

What is claimed is:

1. A signal conversion system for converting an analog input signal to a digital output signal by employing the delta-sigma modulation technique, said signal conversion system comprising:
   input means for receiving an analog input signal to be converted to a digital signal;
   a plurality of analog-digital delta-sigma converters connected in parallel to said input means for respectively receiving the analog input signal therefrom at the input of each of said plurality of analog-digital delta-sigma converters;
   each said analog-digital delta-sigma converter including a quantizer for converting the analog input signal into a digital signal representative thereof, each of said quantizers producing quantization noise in converting the analog input signal into a digital signal;
   a plurality of dither generators corresponding to the plurality of analog-digital delta-sigma converters to provide a respective dither generator for each of said analog-digital delta-sigma converters, each said dither generator utilizing random variables unrelated to the respective random variables utilized by the other dither generators for producing a dither output signal having a spectrum distribution of noise concentrated in a region of relatively high frequency to define a colored noise signal and being connected to the quantizer of said analog-digital delta-sigma converter corresponding thereto; and
   an adder connected in parallel to the outputs of each of said plurality of analog-digital delta-sigma converters for providing an output signal as a digital output signal comprising the added outputs of said plurality of analog-digital delta-sigma converters;
   whereby the addition of the colored noise signals produced by the plurality of different dither generators as included in the outputs of said plurality of analog-digital delta-sigma converters effectively averages the quantization noise to provide an approximation of a white noise signal such that an improved dynamic range over a wide frequency band region is achievable for a relatively low frequency region by the signal conversion system.

2. A signal conversion system as set forth in claim 1, further including a bandpass filter interposed between each said dither generator and the quantizer of the analog-digital delta-sigma converter corresponding thereto and interconnecting the respective dither generator to the corresponding analog-digital delta-sigma converter for concentrating the colored noise signal from the dither generator in the relatively high frequency region.

3. A signal conversion system as set forth in claim 2, wherein the region in which the spectrum distribution of the colored noise signal is concentrated by the respective bandpass filter corresponding to each of said plurality of dither generators is in the range of 120 KHz–200 KHz.

4. A signal conversion system for converting a digital input signal to an analog output signal by employing the delta-sigma modulation technique, said signal conversion system comprising:
   input means for receiving a digital input signal to be converted to an analog signal;
   a plurality of digital-analog delta-sigma converters connected in parallel to said input means for respectively receiving the digital input signal therefrom at the input of each of said plurality of digital-analog delta-sigma converters;
   each said digital-analog delta-sigma converter including a quantizer for converting the digital input signal into an analog signal representative thereof, each of said quantizers producing quantization noise in converting the digital input signal into an analog signal;
   a plurality of dither generators corresponding to the plurality of digital-analog delta-sigma converters to provide a respective dither generator for each of said digital-analog delta-sigma converters, each said dither generator utilizing random variables unrelated to the respective random variables utilized by the other dither generators for producing a dither output signal having a spectrum distribution of noise concentrated in a region of relatively high frequency to define a colored noise signal and being connected to the quantizer of said digital-analog delta-sigma converter corresponding thereto; and
   an adder connected in parallel to the outputs of each of said plurality of digital-analog delta-sigma converters for providing an output signal as an analog output signal comprising the added outputs of said plurality of digital-analog delta-sigma converters;
   whereby the addition of the colored noise signals produced by the plurality of different dither generators as included in the outputs of said plurality of digital-analog delta-sigma converters effectively averages the quantization noise to provide an approximation of a white noise signal such that an improved dynamic range over a wide frequency band region is achievable for a relatively low frequency region by the signal conversion system.

5. A signal conversion system as set forth in claim 4, further including a bandpass filter interposed between each said dither generator and the quantizer of the digital-analog delta-sigma converter corresponding thereto and interconnecting the respective dither generator to the corresponding digital-analog delta-sigma converter for concentrating the colored noise signal from the dither generator in the relatively high frequency region.

6. A signal conversion system as set forth in claim 5, wherein the region in which the spectrum distribution of the colored noise signal is concentrated by the respective bandpass filter corresponding to each of said plurality of dither generators is in the range of 120 KHz-200 KHz.

7. A signal conversion system as set forth in claim 4, further including a low pass filter connected to the output of said adder for filtering the analog output signal provided at the output of said adder.

* * * * *